(12) United States Patent
Kim et al.

(10) Patent No.: US 6,455,329 B1
(45) Date of Patent: Sep. 24, 2002

(54) METHOD FOR FABRICATING A CAPACITOR IN A SEMICONDUCTOR DEVICE

(75) Inventors: Nam Kyeong Kim; Seung Jin Yeom, both of Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/022,512

(22) Filed: Dec. 20, 2001

(30) Foreign Application Priority Data

Dec. 21, 2000 (KR) ...................... P2000-79640

(51) Int. Cl.[7] ................................ H01E 7/06
(52) U.S. Cl. .......................... 438/3; 438/240
(58) Field of Search ............ 438/3, 240, 238, 438/253–256, 381, 396–399

(56) References Cited

U.S. PATENT DOCUMENTS 5,274,249 A * 12/1993 Xi et al. .................. 257/33

* cited by examiner

Primary Examiner—Jey Tsai
(74) Attorney, Agent, or Firm—Morgan, Lewis & Bockius LLP

(57) ABSTRACT

A method for fabricating a capacitor in a semiconductor device includes forming a semiconductor device having a source, a drain, and a gate on a semiconductor substrate, forming an interlayer insulating film having a contact hole exposing the source, forming a conductive layer in the contact hole, forming a lower electrode on the interlayer insulating film, inclusive of the conductive layer, coating an insulating material on the lower electrode for forming a dielectric film, subjecting the insulating material to a first rapid thermal annealing of a first temperature in a chamber, to form nuclei oriented along an a-b axis, subjecting the insulating material to a second rapid thermal annealing at a second temperature higher than the first temperature in the chamber, to grow the nuclei oriented along the a-b axis, to form a dielectric film, and forming an upper electrode on the dielectric film.

16 Claims, 3 Drawing Sheets

METHOD FOR FABRICATING A CAPACITOR IN A SEMICONDUCTOR DEVICE

This application claims the benefit of the Korean Application No. P2000-79640 filed on Dec. 21, 2000, which is hereby incorporated by reference.

BACKGROUND OF THE INVENTION

1. Field of the Invention

The present invention relates to a semiconductor device, and more particularly, to a method for fabricating a capacitor in a semiconductor device.

2. Background of the Related Art

In general, a BLT $(Bi_{4-x}, La_x)Ti_3O_{12}$ thin film has approx. 4 $uC/cm^2$ polarization value when the BLT thin film is oriented in c-axis direction, and approx. 50 $uC/cm^2$ polarization value when the BLT thin film is oriented in a-b-axis direction, i.e., more than 10 times greater.

A related art capacitor is fabricated by forming a lower electrode of a metal, forming a dielectric film on the lower electrode, subjecting to heat treatment in a furnace, and forming an upper electrode. When heat treated thus, most of the dielectric film is oriented in c-axis direction, with exceptional minute regions oriented in other axes.

The foregoing related art method for fabricating a capacitor has a problem in that, since most of the dielectric film is oriented in c-axis direction, with a low intensity of polarization, a contribution of the dielectric film to enhancement of electric performance of the capacitor is poor.

SUMMARY OF THE INVENTION

Accordingly, the present invention is directed to a method for fabricating a capacitor in a semiconductor device that substantially obviates one or more of the problems due to limitations and disadvantages of the related art.

An object of the present invention is to provide a method for fabricating a capacitor in a semiconductor device, which can enhance electric performances of the capacitor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a capacitor in a semiconductor device includes forming a semiconductor device having a source, a drain, and a gate on a semiconductor substrate, forming an interlayer insulating film having a contact hole exposing the source, forming a conductive layer in the contact hole, forming a lower electrode on the interlayer insulating film, inclusive of the conductive layer, coating an insulating material on the lower electrode for forming a dielectric film, subjecting the insulating material to a first rapid thermal annealing of a first temperature in a chamber, to form nuclei oriented along an a-b axis, subjecting the insulating material to a second rapid thermal annealing at a second temperature higher than the first temperature in the chamber, to grow the nuclei oriented along the a-b axis, to form a dielectric film, and forming an upper electrode on the dielectric film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

The semiconductor device in which the capacitor of the present invention is formed is a non-volatile memory. The capacitor of $(Bi_{4-x}, La_x)Ti_3O_{12}$ (BLT) dielectric film is formed by two steps of Rapid Thermal Annealing (RTA). That is, a first RTA is conducted at a first temperature of about 500° C., to form nuclei, and a second RTA is conducted at a second temperature of about 600° C. or higher in-situ in the same chamber, to grow the nuclei, to form the BLT dielectric film.

According to the foregoing process, a capacitor of a BLT dielectric film oriented in a-b axis direction can be formed. In the RTA process, the BLT crystallizes to form a film oriented in a c-axis direction mostly at a temperature higher than about 600° C., oriented in a mixture along the c-axis direction and an a-b axis direction at a temperature up to about 575° C., and oriented along an a-b axis direction at a temperature lower than about 525° C.

The BLT thin film has a polarization value of about 4 $uC/cm^2$ when the BLT thin film is oriented in the c-axis direction, and about 50 $uC/cm^2$ when the BLT thin film is oriented along the a-b-axis direction, i.e., more than about 10 times greater. Therefore, in order to form the BLT thin film having an excellent polarization, formation of nuclei oriented in the a-b axis is required.

A method for fabricating a capacitor oriented along the a-b axis in a semiconductor device in accordance with a preferred embodiment of the present invention will be explained, with reference to the attached drawings. FIGS. 1A–1E illustrate sections showing the steps of a method for fabricating a capacitor in a semiconductor device in accordance with a preferred embodiment of the present invention, and FIG. 2 illustrates a temperature profile during formation of a dielectric film in accordance with a preferred embodiment of the present invention.

Figure 1A:
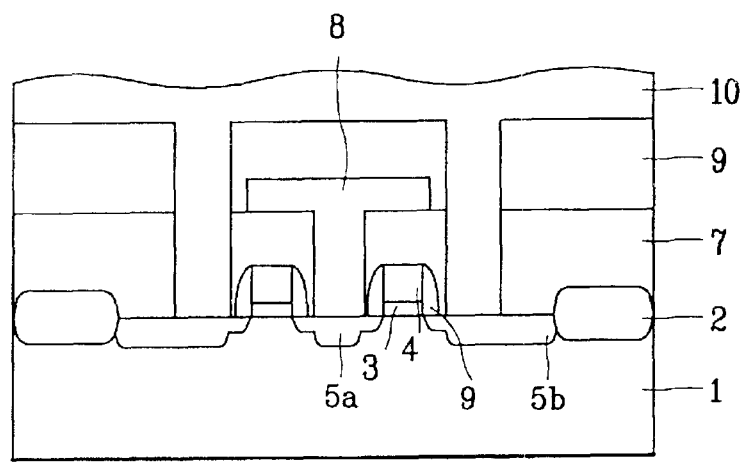
FIGS. 1A–1E illustrate sections showing the steps of a method for fabricating a capacitor in a semiconductor device in accordance with a preferred embodiment of the present invention.
Figure 2:
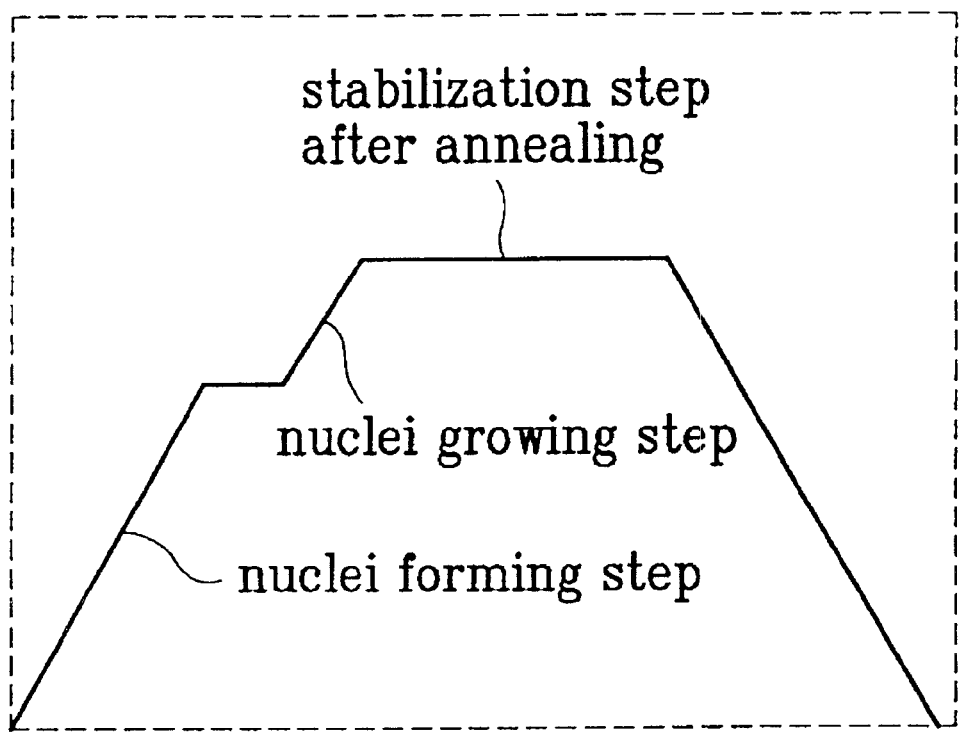
FIG. 2 illustrates a temperature profile during formation of a dielectric film in accordance with a preferred embodiment of the present invention.

Referring to FIG. 1A, the method for fabricating a capacitor oriented along the a-b axis in a semiconductor device in accordance with an exemplary embodiment of the present invention starts with defining an active region, and a field region on a silicon substrate 1, and forming a field oxide film 2 in the field region. Then, a stack of a gate insulating film of an oxide, a gate electrode 3, and a cap insulating film 4 are formed in the active region by using a gate mask.

Then, sidewall spacers 6 are formed at both sides of the gate electrode 3, and the cap insulating film 4, and impurity ions are injected into regions of the silicon substrate 1 on both sides of the sidewall spacers 6 heavily, to form a drain region 5a, and a source region 5b, therein. The drain region 5a, and the source region 5b may be formed as an Lightly Doped Drain (LDD) structure by lightly injecting impurities into the silicon substrate 1 before formation of the sidewall spacers 6. For reference, FIGS. 1A–1E illustrate sections showing formation of two gate electrodes 3, and a common drain 5a in a substrate between two gate electrodes 3.

An interlayer insulating film 7 is formed on an entire surface of the silicon substrate 1, inclusive of the gate electrode 3, and subjected to anisotropic etching to expose a region of the drain region 5a, to form a bitline contact hole, and a bitline 8 is formed in the bitline contact hole and on the interlayer insulating film 7 in the vicinity of the bitline contact hole. A second interlayer insulating film 9 is formed on the first interlayer insulating film 7, inclusive of the bitline 8, and the second, and first interlayer insulating films 9, and 7 are etched in succession to expose the source region 5b, to form a contact hole therein. Then, a polysilicon layer 10 is deposited on the second interlayer insulating film 9, inclusive of the contact hole.

Figure 1B:
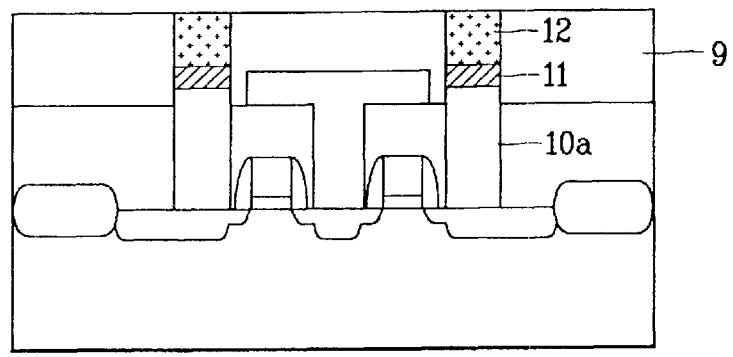
Figure 1C:
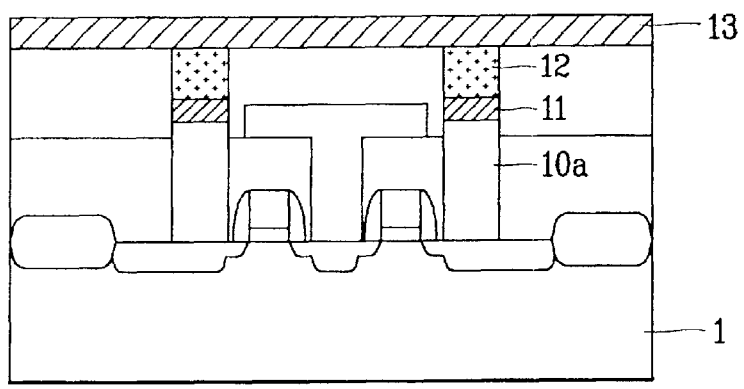

Referring to FIG. 1B, the polysilicon layer 10 is etched excessively, to form a polyplug 10a having a depth in the contact hole. The excessive etch of the polysilicon layer 10 is conducted such that an upper part of the second interlayer insulating film 9 is exposed, and a depth of the polysilicon layer 10 in the contact hole is etched. Next, an ohmic layer 11 of titanium silicide is formed on the polyplug 10a, and a barrier metal film 12 of titanium nitride is formed on the ohmic layer 11. In this instance, for forming a flat polyplug 10a in the contact hole, a chemical-mechanical polishing is applied. As shown in FIG. 1C, a lower electrode 13 is formed on the second interlayer insulating film 9, inclusive of the barrier metal film 12.

Figure 1D:
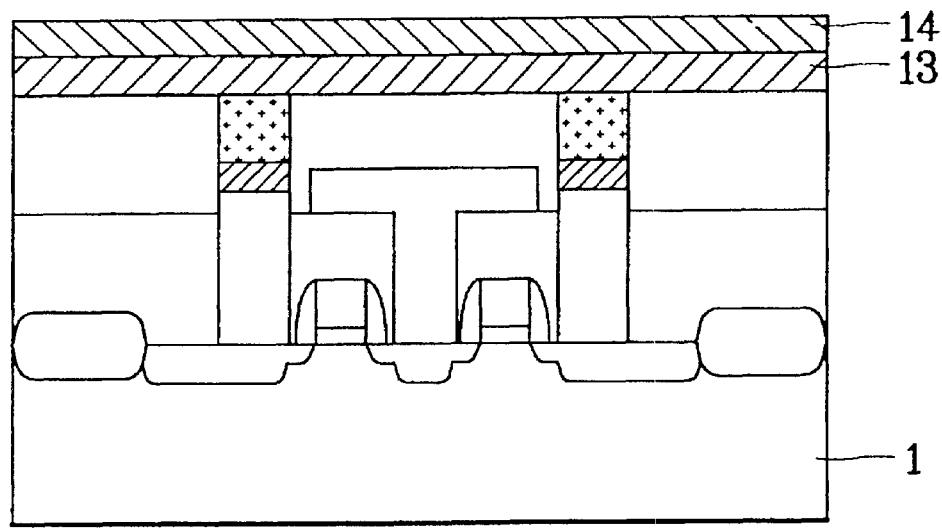

Referring to FIG. 1D, a $(Bi_{4-x}, La_x)Ti_3O_{12}$ (BLT) film is coated, and subjected to a first, and a second baking, i.e., a first, and a second Rapid Thermal annealing (RTA), to form nuclei oriented in a-b axis, and to form a dielectric film 14 having the nuclei grown. In the dielectric film of BLT, Bi has about 3.25–3.35 atomic concentration, and La has about 0.8–0.9 atomic concentration.

Referring to FIG. 2, a process profile in formation of the dielectric film 14 has the steps of forming nuclei by the first annealing, growing the nuclei by second high temperature annealing, and stabilization annealing after boosting a pressure.

The BLT film is coated by spin-on of a liquid source, or by Metal Organic Deposition (MOD). For forming a dielectric film oriented only along the a-b axis, the first RTA process is conducted at a ramp-up rate in a range of about 50–300° C./sec in a temperature range of about 475–525° C. by using reaction gas of $N_2$, $O_2$, $N_2O$, or $O_2+N_2$. The second RTA process is conducted at a ramp-up rate in a range of about 50–300° C./sec in a temperature range of about 550–750° C. by using reaction gas of $N_2$, $O_2$, $N_2O$, or $O_2+N_2$. The first, or second RTA is conducted at the atmospheric pressure.

After the first, and second RTA, the nuclei are grown in a furnace at a temperature ranging about 500–700° C. by using $O_2$, $N_2O$, or $O_2+N_2$.

Figure 1E:
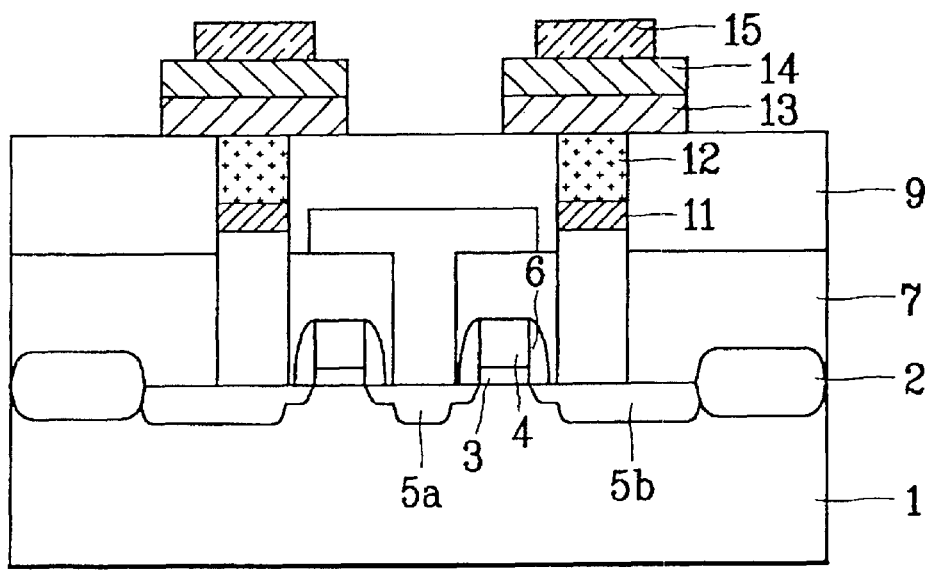

Then, referring to FIG. 1E, an upper electrode 15 is deposited on the dielectric film 14. Thereafter, the upper electrode 15, the dielectric film 14, and the lower electrode 13 are etched, by using a capacitor mask, to finish fabrication of the capacitor. The lower electrode 13 and the upper electrode 15 are formed of Ir, IrOx, Ru, RuOx, Pt, or W deposited by Metal Organic Chemical Vapor Deposition (MOCVD), or Physical Vapor Deposition (PVD).

As has been explained, the method for fabricating a capacitor in a semiconductor device has the following advantage.

The formation of a dielectric film oriented in an a-b axis having a great polarization value by two steps of RTA (a low temperature annealing to a high temperature annealing) can enhance electric performance of the capacitor.

It will be apparent to those skilled in the art that various modifications and variations can be made in the method for fabricating a capacitor in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor in a semiconductor device, comprising the steps of:

forming a semiconductor device having a source, a drain, and a gate on a semiconductor substrate;

forming an interlayer insulating film having a contact hole exposing the source;

forming a conductive layer in the contact hole;

forming a lower electrode on the interlayer insulating film, inclusive of the conductive layer;

coating an insulating material on the lower electrode for forming a dielectric film;

subjecting the insulating material to a first rapid thermal annealing of a first temperature in a chamber, to form nuclei oriented along an a-b axis;

subjecting the insulating material to a second rapid thermal annealing at a second temperature higher than the first temperature in the chamber, to grow the nuclei oriented along the a-b axis, to form a dielectric film; and forming an upper electrode on the dielectric film.

2. The method according to claim 1, wherein the insulating material includes $(Bi_{4-x}, La_x)Ti_3O_{12}$.

3. The method according to claim 1, wherein the first temperature of the first rapid thermal annealing is within a temperature range of about 475–525° C.

4. The method according to claim 1, wherein the first temperature of the first rapid thermal annealing is at a ramp-up rate of about 50–300° C./sec.

5. The method according to claim 1, wherein the first rapid thermal annealing is conducted using at least one reaction gas of $N_2$, $O_2$, $N_2O$, and $O_2+N_2$.

6. The method according to claim 1, wherein the second temperature of the second rapid thermal annealing is within a temperature range of about 550–750° C.

7. The method according to claim 1, wherein the second temperature of the second rapid thermal annealing is at a ramp-up rate of about 50–300° C./sec.

8. The method according to claim 1, wherein the second rapid thermal annealing is conducted using at least one reaction gas of $N_2$, $O_2$, $N_2O$, and $O_2+/N_2$.

9. The method according to claim 1, further comprising a step of conducting a third annealing in a furnace at a third temperature within about 500–700° C. after the first, and second rapid thermal annealing, for growing crystal grains.

10. The method according to claim 1, wherein the step of forming a conductive layer includes the steps of:
   depositing a semiconductor layer on the contact hole, and the interlayer insulating film;
   etching the semiconductor layer excessively, to form a plug having a depth in the contact hole;
   forming an ohmic layer on the plug in the contact hole; and
   forming a barrier metal film on the ohmic layer in the contact hole.

11. The method according to claim 10, wherein the semiconductor layer includes polysilicon.

12. The method according to claim 10, wherein the ohmic layer includes titanium silicide.

13. The method according to claim 10, wherein the barrier metal film includes titanium nitride.

14. The method according to claim 1, wherein the insulating material is coated by one of spin-on and Metal Organic Deposition (MOD) processes.

15. The method according to claim 1, wherein one of the lower electrode and the upper electrode is deposited by one of Metal Organic Chemical Vapor Deposition (MOCVD) and Physical Vapor Deposition (PVD).

16. The method according to claim 1, wherein one of the lower electrode and the upper electrode includes at least one of Ir, IrOx, Ru, RuOx, Pt, and W.

* * * * *